United States Patent [19]
Dawson et al.

[11] Patent Number: 6,087,706
[45] Date of Patent: *Jul. 11, 2000

[54] COMPACT TRANSISTOR STRUCTURE WITH ADJACENT TRENCH ISOLATION AND SOURCE/DRAIN REGIONS IMPLANTED VERTICALLY INTO TRENCH WALLS

[75] Inventors: Robert Dawson, Austin; Mark I. Gardner, Cedar Creek; Frederick N. Hause; H. Jim Fulford, Jr., both of Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/056,834

[22] Filed: Apr. 7, 1998

[51] Int. Cl.[7] .............................. H01L 29/00; H01L 29/94
[52] U.S. Cl. .................... 257/520; 257/336; 257/344; 257/382; 257/384; 257/510; 257/513
[58] Field of Search .................................. 257/508, 510, 257/513, 514, 515, 520, 521, 336, 343, 382, 383, 397, 413, 344, 384

[56] References Cited

U.S. PATENT DOCUMENTS 5,683,921  11/1997  Nishio et al. ............................ 438/294
5,844,276  12/1998  Fulford, Jr. et al. .................... 257/336

*Primary Examiner*—Minh Loan Tran
*Attorney, Agent, or Firm*—Skjerven, Morrill, MacPherson, Franklin & Friel, LLP; Ken J. Koestner

[57] ABSTRACT

A semiconductor integrated circuit with a transistor formed within an active area defined by side-walls of a shallow trench isolation region, and method of fabrication thereof, is described. A gate electrode is formed over a portion of the active area and LDD regions formed that are self-aligned to both the gate electrode and the trench side-walls. A dielectric spacer is formed adjacent the gate electrode and extending to the trench side-walls. In this manner, the spacers essentially cover the LDD regions. Source and drain regions are formed that are adjacent the trench side-walls wherein the spacer serves to protect at least a portion of the LDD regions to maintain a spacing of the S/D regions from the gate electrode edge. In this manner an advantageously lowered $E_M$ provided by LDD regions is maintained. In some embodiments of the present invention, S/D regions are formed by implantation through the trench side-walls.

18 Claims, 5 Drawing Sheets

COMPACT TRANSISTOR STRUCTURE WITH ADJACENT TRENCH ISOLATION AND SOURCE/DRAIN REGIONS IMPLANTED VERTICALLY INTO TRENCH WALLS

BACKGROUND OF THE INVENTION

1. Field of the Invention

The present invention relates in general to semiconductor integrated circuit device structures and associated methods of fabrication. More specifically, the present invention relates to a transistor structure for a semiconductor integrated circuit that reduces integrated circuit chip surface area and supplies low source and drain contact resistance.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, source and drain are located in a semiconductor substrate, with the channel being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, polysilicon-Si or polysilicon) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally results in a corresponding decrease in the vertical dimensions. As IGFET vertical dimensions are reduced and the supply voltage remains nearly constant (e.g., 3V), the maximum channel electric field $\epsilon_{ymax}$ near the drain tends to increase. If the electric field becomes strong enough, so-called hot-carrier effects may occur. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum channel electric field $\epsilon_{ymax}$. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD with reduced parasitic resistance as well as a substantially planar top surface. It is especially suitable that the IGFET have a channel length that can be significantly smaller than the minimum resolution of the available lithographic system.

SUMMARY OF THE INVENTION

In accordance with an embodiment of the present invention, a transistor is formed in an active area wherein the width of the active area is defined by shallow isolation trenches. Source and drain regions of the transistor are formed in side-walls of the trenches providing a transistor structure that attains reduced surface area. By reducing the lateral dimension of the source and drain regions. In addition the transistor structure reduces the source and drain contact resistance.

The shallow isolation trenches formed are subsequently filled with a dielectric material and the dielectric material planarized with respect to a surface of the active areas. Gate dielectric and gate electrode structures are formed overlying a portion of at least some of the active area regions. When lightly doped (LDD) source and drain regions are desired, self-aligned regions can be formed adjacent to an edge of each gate electrode and an edge of each shallow isolation trench using well known ion implantation techniques. Dielectric spacers are then formed overlying the LDD regions and then the dielectric material in the isolation trenches is recessed to expose an upper portion of the side-walls. In this manner, implantation of dopants into the side-walls to form source and drain (S/D) regions having a preferred profile is facilitated. Refractory metal salicide regions, electrically coupled to the source and drain regions at the side walls, are formed and metal conductors formed to electrically couple to the salicide regions and provide electrical contact to appropriate other regions.

In accordance with some embodiments of the present invention, LDD regions are not employed and S/D regions are formed directly into the side-walls of the active area after formation of dielectric spacers. In some embodiments of the present invention, refractory metal salicide regions are additionally formed on gate electrodes to provide a low resistance electrical contact region. In other embodiments of the present invention, the dielectric spacers and isolation trench dielectric recess are formed in a single process step. In still other embodiments of the present invention refractory metal plugs are employed to electrically couple the salicide regions to the metal conductors. In this manner, embodiments in accordance with the present invention provide for the realization of a transistor requiring reduced layout area while allowing for lower source and drain contact resistance than transistors previously known. Embodiments of the present invention provide for semiconductor integrated circuits with higher device densities and enhanced performance.

The described semiconductor devices and associated fabrication method have many advantages. The source/drain with a vertical orientation advantageously minimizes series resistance and enhances transistor speed, performance, and density.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where the element is the same between illustrations.

DETAILED DESCRIPTION

Embodiments of the present invention are described with reference to the aforementioned figures. The drawings are simplified for ease of understanding and description of embodiments of the present invention only. Various modifications or adaptations of specific methods and or structures may become apparent to those skilled in the art as embodiments of the present invention are described. All such modifications, adaptations or variations that rely upon the teachings of the present invention, and through which these teachings have advanced the art, are considered to be within the spirit and scope of the present invention. For example, in some embodiments doped regions are formed with an implantation at an angle greater than an industry standard seven degrees, while in other embodiments such regions are formed with the standard angle.

Figure 1:
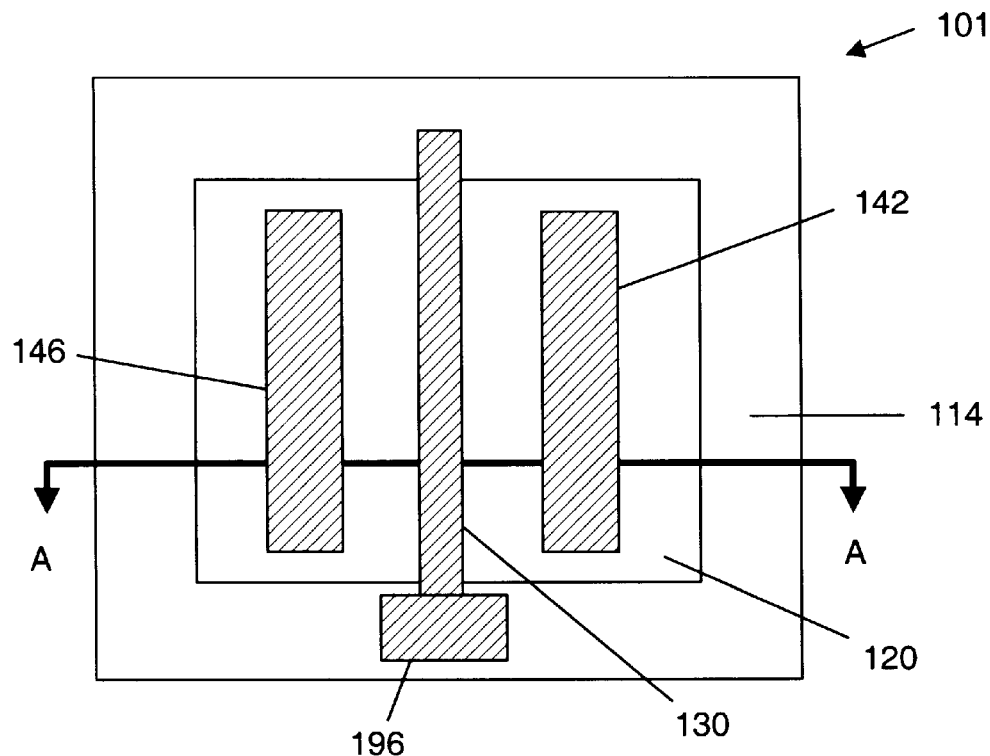
FIG. 1 is a simplified plan view of a transistor.

FIG. 1 is a simplified plan view of a typical transistor 101 having an active area 120 surrounded by a trench isolation region 114. Overlaying the active area 120 is a gate electrode 130 and S/D contacts 142 and 146. The S/D contacts 142 and 146 are electrically coupled to S/D regions (not shown) formed within the active area region 120. A gate contact 196 overlies and is electrically coupled to the gate electrode 130.

Figure 2:
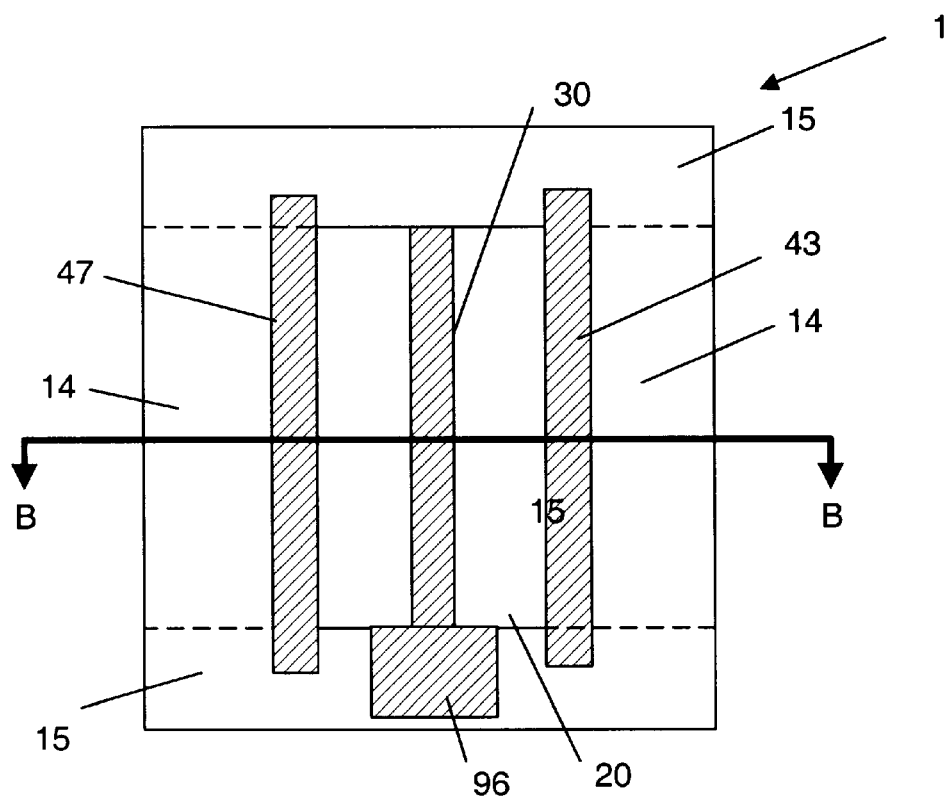
FIG. 2 is a simplified plan view showing an embodiment of a transistor that attains a low source and drain contact resistance.

Referring to FIG. 2, a simplified plan view shows an embodiment of a lateral source/drain transistor 1 that attains a low source and drain contact resistance. An active area 20 is bordered on a first two parallel edges by trench isolation regions 14 and is bordered on second two parallel edges perpendicular to the first two parallel edges by isolation regions 15. The combined trench regions 14 and 15 isolate and define the active region 20. The lateral source/drain transistor 1 includes trench isolation regions 14 that are formed using shallow trench isolation (STI) techniques and similar techniques. The gate electrode 30 overlies active area 20 and a gate contact 96 is formed overlying and electrically coupled to the gate electrode 30. Source/Drain (S/D) contacts (not shown) are formed adjacent side-walls of the active area 20 within the trench isolation region 14 so that only conductive traces 43 and 47 are visible in the plan view. The conductive traces 43 and 47 are electrically coupled to the contacts. The isolation region 15 is typically a region formed using known LOCalized Oxidation of Silicon (LOCOS) techniques or shallow trench isolation techniques.

In another embodiment, the combined shallow trench regions 14 and 15 are formed by the same process and the contact etch process is used to remove sufficient oxide along the edge of the source/drain region to allow subsequent formation of lateral source/drain regions.

Figure 3:
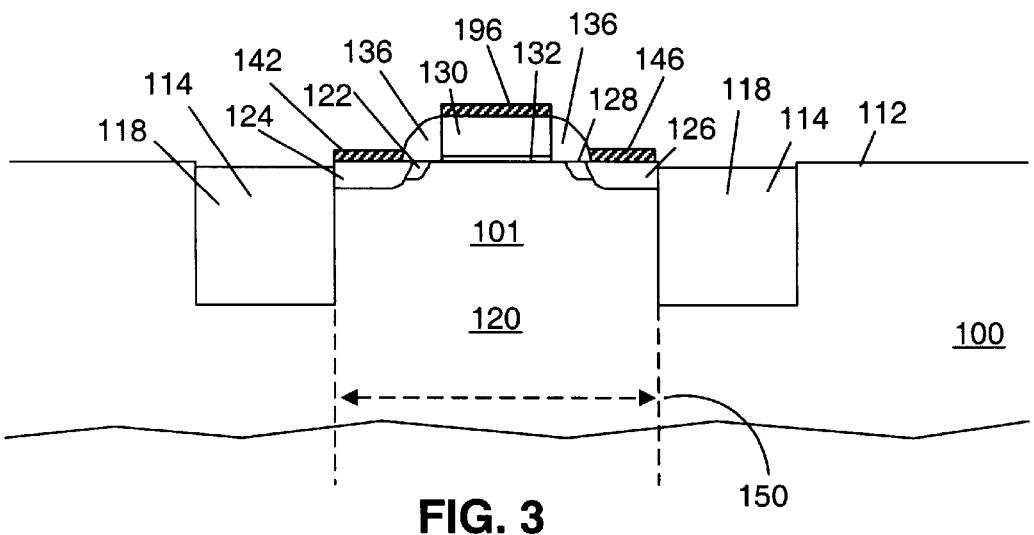
FIG. 3 is a simplified cross-sectional view of the transistor shown in FIG. 1.

Referring to FIG. 3, a cross-sectional representation through section line A—A of the transistor 101 shown in FIG. 1 is depicted. A gate oxide layer 132, the gate electrode 130, side-wall spacers 136, lightly doped drain (LDD) regions 122 and 128, and source/drain (S/D) regions 124 and 126 are formed in a semiconductor substrate 110 within the active area 120 adjacent to a single upper surface 112. The active area 120 has boundaries that are defined by trench isolation regions 114. The trench isolation regions are filled with a trench dielectric 118. S/D salicide contact regions 142 and 146 are shown overlying a portion of S/D regions 124 and 126 respectively. The gate salicide contact region 196 is shown overlying the gate electrode 130. The transistor 101 utilizes the active area 120 having a sufficiently large lateral dimension 150 to accommodate the lateral dimensions of the gate electrode 130, the spacers 136, and S/D regions 124 and 126 including the LDD regions 122 and 128, respectively.

Figure 4A:
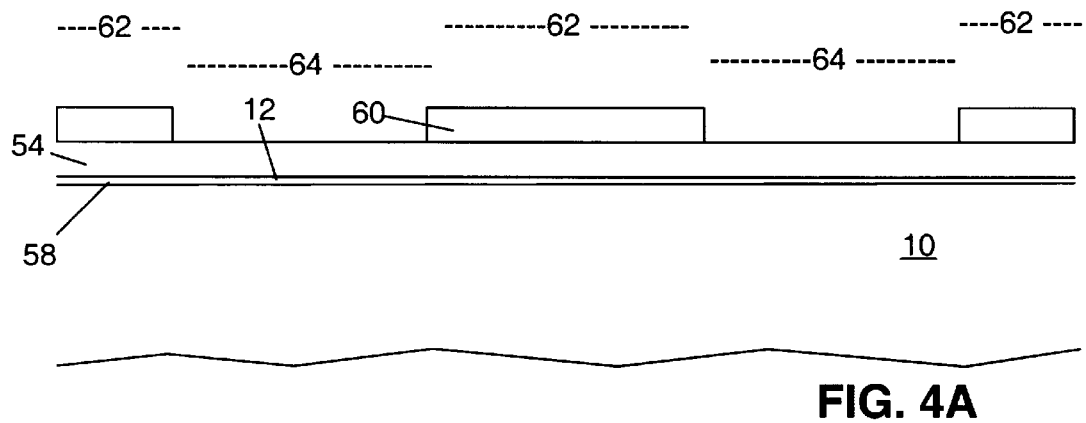
FIGS. 4A through 4H are cross-sectional representations of an embodiment of the transistor shown in FIG. 2 that attains a low source and drain contact resistance.

FIG. 4A is a cross-sectional representation along section line BB of an embodiment of the lateral source/drain transistor 1 shown in FIG. 2 in an early stage of the fabrication process. A semiconductor substrate or wafer 10 is depicted having an overlying hard-mask layer 54 and a photoresist layer 60 formed overlying the upper surface 12 of the substrate wafer 10. The substrate or wafer 10 is shown with a minimum of detail for simplicity and ease of understanding. However, the substrate 10 is typically tailored to maximize the yield and performance of semiconductor circuitry formed in the substrate 10. The substrate or wafer 10 is typically a silicon wafer. Alternatively, the substrate 10 has an epitaxial silicon layer formed on a wafer, such as a single-crystal substrate. In some embodiments, the substrate 10 has doped regions (not shown) formed inside the substrate. The doped regions, for example well regions, are formed using a suitable conventional doping technique.

The hard-mask layer 54 is a layer that is employed to enhance masking of portions of the wafer 10 during a subsequent trench etch step. Typically, the hard-mask layer 54 is formed from a silicon nitride material having a thickness consistent with the photoresist layer 60 and in the range of approximately 40 to 180 nanometers (nm). The hard-mask layer 54 is typically deposited on a thin thermal oxide layer 58 having a thickness in a range from approximately 5 nm to about 50 nm. Materials other than silicon nitride, such as silicon dioxide (oxide), may be employed for hard-mask layer 54. In other embodiments the hard-mask layer 54 is omitted and masking for the etch step is accomplished solely by the photoresist layer 60. Silicon nitride advantageously acts as an oxidation barrier for the initial thermal oxidation of the trench.

Figure 4B:
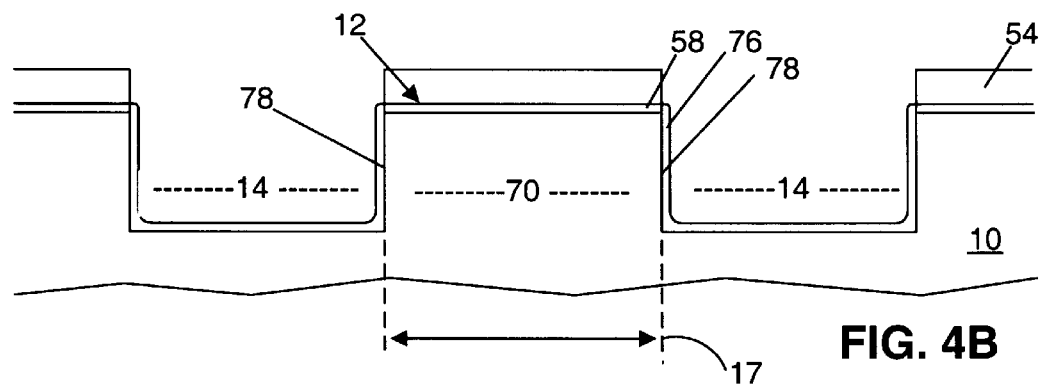

Referring to FIG. 4B in conjunction with FIG. 4A, the photoresist layer 60 is shown patterned to protect first portions 62 and to expose second portions 64 of the hard-mask layer 54. The first portions 62 correspond to regions of the wafer 10 that subsequently form active area regions 70. The second portions 64 correspond to regions of the wafer 10 that become trench regions 14. The photoresist layer 60 is deposited and patterned using standard photolithographic techniques. In regions the hard-mask layer 54 is etched away, the photoresist layer 60 utilizes known photoresist processing and etching operations to define active area regions 70 and trench regions 14 of the wafer 10 and to mask during formation of trench regions 14.

Referring to FIG. 4B, a cross-sectional representation shows the illustrative lateral source/drain transistor 1 following etching to form active areas 70 and trench regions 14. Active area regions or active areas 70, trench regions 14, and a trench liner oxide 76 are shown. The active area regions 70 and the trench regions 14 are formed by etching hard-mask layer 54 to remove second portions 64. The hard-mask layer 54 is etched using a standard, essentially anisotropic etch process. For example, for a hard-mask layer 54 that is composed of silicon nitride, a portion 64 is removed using a plasma etch process, such as a $NF_3$ plasma etch. After removing the portion 64, the underlying wafer 10 is etched at the wafer surface 12 to form trench regions 14 having side-walls 78. Side-walls 78 are lateral boundaries of active area 70. An essentially anisotropic etch process is used to form the trench regions 14 in the wafer 10. For example, a process employing a $CF_4$ or HBr etch process etches silicon to form the trench regions 14, which are commonly known as shallow isolation trenches. The trench regions 14 are formed having a depth between approximately 18 nm to 400 nm, although other suitable depths may be used. The trench regions 14 supply a portion of the electrical isolation between adjacent the active areas 70 and have a minimum width to attain that isolation. A suitable minimum width for the trench regions 14 is approximately 400 nm or greater for trench regions 14 that are formed in a circuit having a design specified with a minimum feature size of 0.25 $\mu$m or larger. Other widths may be used where suitable as determined by the electrical and size specifications of the integrated circuit.

Referring back to FIG. 2, two distinct isolation methods are employed in fabrication of a device in the illustrative embodiments. FIG. 4B illustrates only trench regions 14 and not isolation regions 15 for illustrative purposes. Isolation regions 15 are typically formed using known LOCOS techniques and do not form side-walls on the active area 70. Thus trench regions 14 define one pair of parallel edges of the region 70 that bound the active area 70 having an active area width 17 shown in FIG. 4B while isolation regions 15 define the other pair of edges and the active area length.

The trench oxide liner 76 is formed by a standard thermal oxidation step. The trench oxide liner 76 is formed to heal etch damage caused during trench formation, to oxidize etch residue formed at side-walls 78, if any, and to form an insulating barrier. Typically, trench oxide liner 76 has a thickness in the range of approximately 10 nm to 75 nm. In some embodiments, the hard-mask mask layer 54 is removed prior to formation of oxide liner 76. If the hard-mask layer 54 is removed prior to formation of trench oxide liner 76, oxidation of the surface 12 in active regions 70 occurs and an oxide layer (not shown) is formed.

The active area width or lateral dimension 17 is a transistor design criterion that is variably selected for different active areas 70 within an integrated circuit. The active area width or lateral dimension 17 is selected on the basis of the characteristics, size and number of semiconductor devices and/or structures formed in the substrate 10. The lateral dimension 17 spans the channel width of the device formed in region 70. For example, the active areas 70 of some transistors have a lateral dimension 17 that is selected to form a small channel width. Active areas 70 of other transistors have a larger lateral dimension 17 to set a large channel width. The channel width is one factor that determines the performance of a transistor.

In some embodiments an optional channel stop implant (not shown) is performed to form a doped channel stop region (not shown) under trench regions 14. The optional channel stop region enhances electrical isolation between adjacent active areas 70. Typically an optional channel stop implant is performed prior to forming the trench oxide liner 76, although in some embodiments a channel stop implant is performed after formation of the trench oxide liner 76.

Figure 4C:
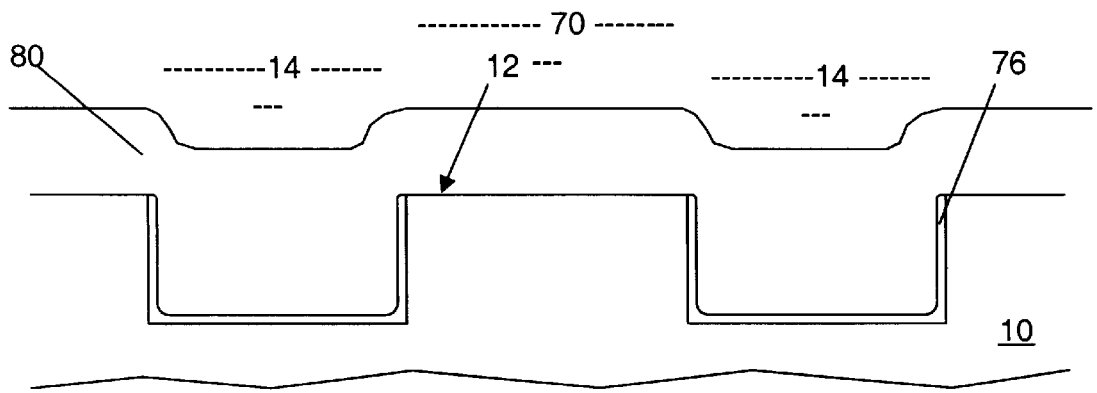

Referring to FIG. 4C, a cross-sectional representation shows the illustrative lateral source/drain transistor 1 following removal of the hard-mask layer 54. The hard-mask layer 54 is removed and an isolating trench fill material 80 is deposited. Typically, the fill material 80 is deposited to a thickness slightly less than approximately two times the depth of the trench regions 14. For example, trench regions 14 having a depth of 400 nm typically utilize fill material 80 with a thickness in a range from approximately 700 nm to 800 nm. The trench fill material 80 is selected from among several materials. Silicon dioxide (oxide) formed using a hot-wall TEOS source low-pressure chemical vapor deposition (LPCVD) is a suitable material. Other known conformal or filling deposition methods and materials for depositing trench fill material 80 to various thicknesses may be employed. For a selected method and trench fill material 80, the trench regions 14 are completely filled with no voids. Generally the trench fill material 80 extends above the trench regions 14 and the surface 12 of the active area regions 70.

Figure 4D:
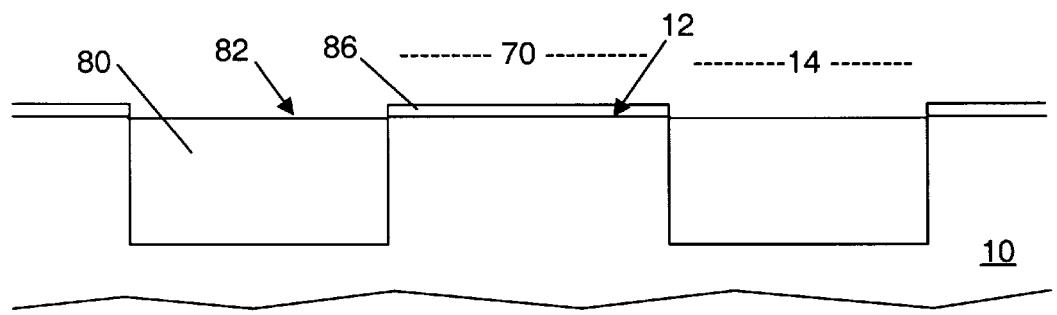

Referring to FIG. 4D, the fill material 80 is planarized so that an upper surface 82 of fill material 80 is essential planar with the surface 12 of active areas 70. A Chemical Mechanical Polishing (CMP) process is suitable for planarizing the trench fill material 80 although other suitable planarization methods may otherwise be employed. In some method embodiments, combinations of multiple planarization methods, such as a negative image photoresist etch-back combined with CMP, may be employed. Variations in pattern density and geometry are factors in selecting a suitable planarization process for specific devices and designs. The selection of a planarization method is a design choice from among known suitable choices. Typically, the planarization process employed is designed to leave approximately 50 nm to 80 nm of trench fill material 80 overlying active areas 70. Typically, 50 nm to 80 nm of trench fill material 80 is removed using an etch process that exposes the surface 12 of active areas 70.

In some embodiments, one or more channel tailoring implants or diffusions are performed into some or all of the active areas 70. For example, an implant for adjusting threshold voltage for NMOS and PMOS transistors is performed. In some embodiments, a sacrificial oxide layer (not shown) is formed using standard oxidation or deposition techniques prior to a channel tailoring implant. If a sacrificial layer is formed, the sacrificial layer is removed following implantation but before forming a gate dielectric layer 86. In other embodiments, channel tailoring implants are performed into the active areas 70 without forming an overlying layer. In still other embodiments, the channel tailoring implants are performed after formation of the gate dielectric layer 86. The gate dielectric layer 86 is typically a silicon dioxide layer having a thickness in the range of approximately 3 nm to 15 nm and is formed in the active areas 70 by thermal oxidation of the surface 12. The gate dielectric layer 86 thickness is determined, in part, by device performance factors. Therefore, thicknesses outside the illustrative range may be selected in conditions where specific device performance factors warrant a change. The selection of alternative gate dielectric layer thicknesses is a design choice from among known suitable choices.

Figure 4E:
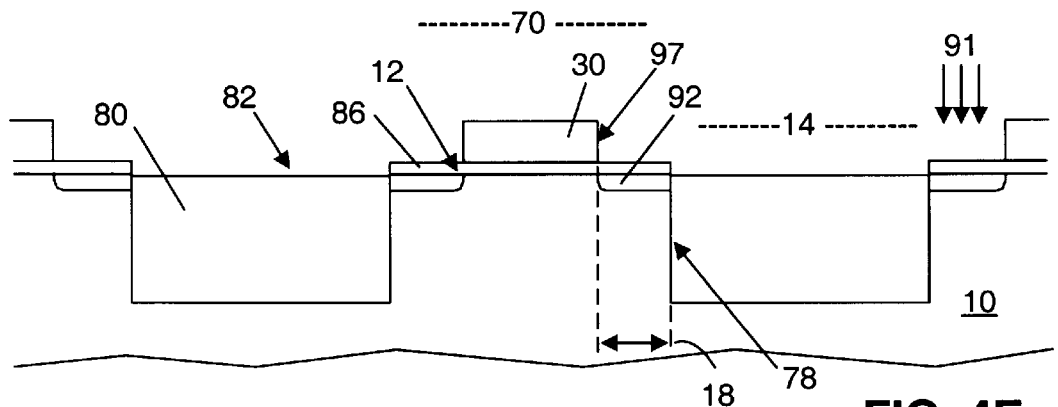

Referring to FIG. 4E, the lateral source/drain transistor 1 is shown following deposition and patterning of a layer of gate electrode material (not shown) to form gate electrodes 30 overlying the gate dielectric layer 86 on at least some active areas 70. In some embodiments, the gate electrodes 30 are formed overlying a portion of active area 70 and are defined by lateral edges 97. Each lateral edge 97 is positioned approximately a distance 18 from each side-wall 78. The gate electrodes 30 are typically formed from polysilicon using standard deposition and photolithography processes. Typically, the gate electrodes 30 are approximately 100 nm to 250 nm thick although other suitable thicknesses, either greater or smaller may be successfully employed.

The gate electrodes 30 mask a portion of the active areas 70 during an LDD implant 91 operation. LDD regions 92, also called first-doped regions, are formed adjacent to the surface 12, are self-aligned to the lateral edge 97 of the gate electrode 30, and extend to the proximate side-wall 78 of the trench region 14. The LDD or first-doped regions 92 have a defined size that extends from the lateral gate edge 97 to the side-wall 78. An N-type dopant is implanted at a suitable dosage within a range of dosages that is known in the semiconductor processing arts to form NMOS transistors in active areas 70. For example, phosphorus (P) is implanted at a dose in a range from approximately 5E13 to 5E14 and an energy in a range from about 10 kEV to 30 kEV. A PMOS transistor is formed in the active areas by first implanting a P-type dopant at a suitable dosage to form the LDD implant 91. For example, Boron (B) is implanted at a dose in a range from 5E13 to 3E14 and an energy in a range from 5 kEV to 20 kEV.

Figure 4F:
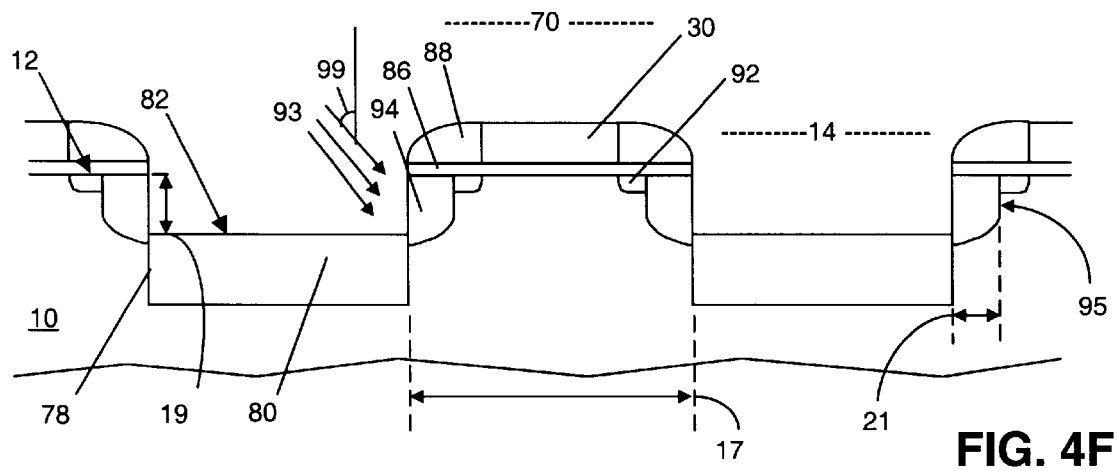

Referring to FIG. 4F, a cross-sectional representation shows the lateral source/drain transistor 1 following formation of dielectric spacers 88. A dielectric spacer layer (not shown) is deposited and etched to form the dielectric spacers 88 adjacent to the gate electrodes 30. The dielectric spacers 88 are formed from a material selected from a variety of suitable dielectric materials. In some examples, silicon nitride, silicon oxynitride and the like are suitable dielectric materials for spacer 88 formation. A suitable spacer material supplies a stop layer for a contact slot etch. In some embodiments, the spacers 88 are formed and the trench fill material 80 is recessed to a trench depth 19 in a single etching step. In the etching step, the dielectric spacers 88 are formed of a material that etches at a slower rate than the trench fill material 80. Accordingly, the choice of material for the dielectric spacers 88 is influenced by the composition of trench fill material 80. For example if silicon dioxide is chosen as the trench fill material 80, then the spacers 88 are formed from a material that etches slower than silicon dioxide, such as silicon oxynitride which etches at a slower rate than silicon dioxide when a $CHF_3$ etch process is employed. In other examples, a process that etches the trench fill material 80 at a rate approximately one to two times faster than the spacer material 88 is etched attains a recess surface 82 of the trench depth 19 before the size and shape of spacers 88 are adversely affected. The illustrative method advantageously forms the spacers 88 and recesses the trench fill material 80 in a single process step. In other method embodiments, a similar structure is formed using multiple steps.

In one embodiment, silicon dioxide is used as the trench fill material 80 and silicon nitride is used to form the dielectric spacers 88 using a process that etches silicon nitride selective of silicon dioxide. A second etch step which is chosen to etch silicon dioxide selective of silicon nitride, recesses the trench fill material 80 by the trench depth 19. The trench depth 19 is typically between approximately 100 nm and 200 nm and is usually no greater than approximately one-half the depth of the trench regions 14. For example, for trench regions 14 having a depth of 300 nm the trench depth 19 is typically between approximately 100 nm and 150 nm.

Source/drain (S/D) regions 94, which are also called second doped regions, are implanted into the active region 70 along and adjacent to the side-wall 78 of trench regions 14. In some embodiments, the S/D regions 94 are formed by a source/drain (S/D) implant 93 directed into side-walls 78. The S/D regions 94 formed by the S/D implant 93 extend into the substrate 10 from the side-wall 78 a lateral depth 21 as defined by maximum lateral depth 95. The S/D regions 94 are implanted into the vertical side-wall 78 of the trench regions 14 in contrast to the LDD regions 92 that are implanted into the horizontal surface 12 of the substrate 10. The S/D regions 94 thus extend essentially orthogonal to the LDD regions 92. Typically, the maximum lateral depth 95 of the S/D region 94 is controlled so that the S/D regions 94 does not completely cover the LDD regions 92. A portion of LDD region 92 is left intact to maintain a more lightly doped region between the maximum lateral depth 95 and the gate electrode 30 so that the normal lowering of the maximum electric field ($E_M$) in the drain region is maintained. Specified fabrication parameters and characteristics of S/D implant 93 include selection of implant angle 99, dopant species, implant energies and concentrations, and the like so that specific electrical characteristics are attained for the lateral source/drain transistors 1.

In embodiments utilizing an implant angle 99 of a standard seven degrees or less, very little of the S/D implant 93 passes through the dielectric spacers 88 so that very narrow S/D regions 94 are formed. The dosage and energy of the S/D implant 93 are selected for standard, low tilt angle implants based upon the shape, thickness and material of dielectric spacers 88. Variations in shape and thickness of the dielectric spacers 88 lead to differences in S/D region structure. Suitable S/D regions 94 are alternatively formed by directing the S/D implant 93 into the side-wall 78 using an implant angle 99 greater than the seven degree standard angle. The dielectric spacers 88 advantageously mask and thereby protect portions of the LDD regions 92 during the S/D implant 93. In some embodiments, the S/D implant 93 is performed at an implant angle 99 that is greater than the standard seven degree angle.

Although increasing the implant angle 99 to an angle greater than seven degrees is suitable, a S/D implant angle 99 of greater than approximately 20 degrees is more suitable. For example, an arsenic (As) source/drain (S/D) implant using an implant angle 99 of about 30 degrees and an energy in the range from approximately 10 kEV to 50 kEV and a dose in the range from approximately 1E15 to about 5E15 is highly suitable. Specific implant energies and dosages for S/D implant 93 are selected to attain desired electrical characteristics. Selected energies and dosages may be utilized that are outside example ranges mentioned above. Alternate energy or dose selections are design choices from among known suitable options.

Figure 4G:
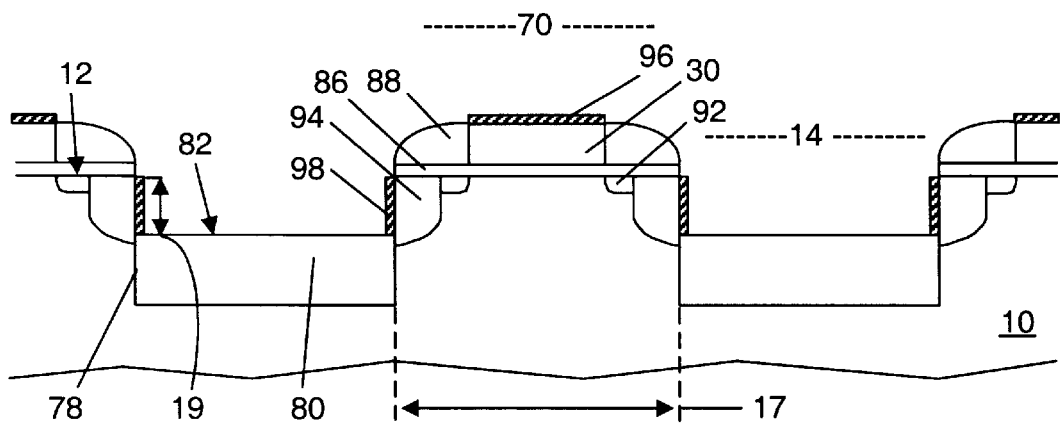

Referring to FIG. 4G, S/D contact regions 98 and gate contact regions 96 are self-aligned silicide regions formed by a salicide process applied to the underlying S/D region 94 and the underlying gate electrode 30. The trench fill material 80 prevents bridging between adjacent S/D contact regions 98 formed within a trench region 14. The dielectric spacer 88 and the gate dielectric 86 also prevent bridging between the gate contact region 96 and either of the adjacent S/D contact regions 98. The S/D contact regions 98 are advantageously formed adjacent to the side-walls 78 by recessing the surface 82 by the trench depth 19 to expose the side-walls 78. The S/D contact regions 98 are formed on the vertical side-walls 78 so that only a minimal amount of the horizontal surface 12 of the substrate 10 is used to form electrical contacts. The lateral source/drain transistor 1 realizes a significant reduction in lateral dimension 17 in comparison to lateral dimension 50 of the transistor shown in FIG. 3. The S/D contact regions 98 have a large surface area that results in a reduced contact resistance than is attainable using conventional techniques and structures. A lowering in S/D contact resistance enhances transistor performance. Silicide contact regions 98 and 96 are formed from a suitable commonly-employed metal such as titanium, cobalt, tantalum, or the like. For example in some embodiments, the contact regions 98 and 96 are formed of titanium silicide. In alternative exemplary embodiments, contact regions 98 and 96 are formed from cobalt silicide or tantalum silicide.

Figure 4H:
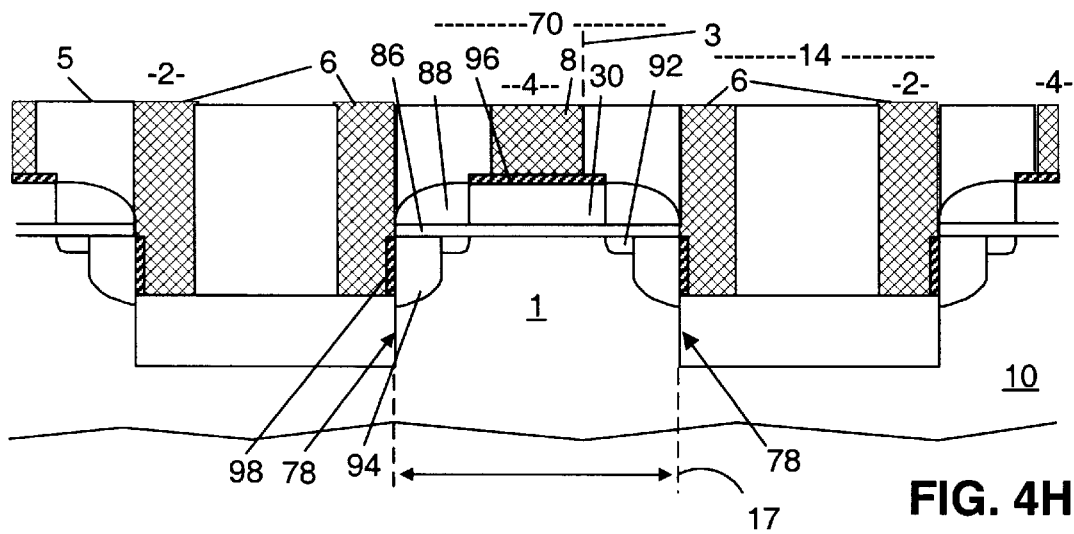

Referring to FIG. 4H, an essentially planar dielectric layer 5 is deposited and chemical mechanical polished (CMP) to an essentially planar surface. The planar dielectric layer 5 is patterned to define S/D contact openings 2 and gate contact openings 4. Advantageously, the gate contact openings 4 are suitably patterned and formed without critical alignment to another layer or structure. For example, the edge 3 of dielectric layer 5 is aligned freely at various positions overlying the gate electrode 30 and spacers 88 between lateral boundaries of the spacers 88, effectively forming S/D contact openings 2 that are separate from the gate contact openings 4. One side of the gate contact openings 4 is formed by the S/D contact region 98 so that no portion of the S/D contact region 98 is necessarily covered by a dielectric material to define gate contact opening 4.

The dielectric layer 5 and dielectric spacers 88 are usually formed from different materials so that the dielectric layer 5 is etched preferentially over the etching of the dielectric spacers 88. In one example, the dielectric spacers 88 are fabricated from silicon oxynitride or silicon nitride and the dielectric layer 5 is formed from silicon dioxide. Silicon oxynitride etches more slowly than silicon dioxide so that the S/D contact openings 2 and the gate contact openings 4 are formed while avoiding significant etching of the dielectric spacers 88. The material selected for fabricating the dielectric layer 5 depends, among other things, upon the material utilize to form the dielectric spacers 88. The dielectric layer 5 typically has a thickness in a range from approximately 700 nm to about 1200 nm.

In some embodiments, the gate contact openings 4 and the S/D contact openings 2 are subsequently filled by S/D contact plugs 6 and gate contact plugs 8 that are formed using a selective tungsten (W) process. In other embodiments other contact plug formation processes and materials are employed such as a non-selective blanket deposition process and an etch-back operation or chemical-mechanical polish (CMP).

The lateral source/drain transistors 1 that are formed within the active area 70 having a lateral dimension 17 which is substantially reduced in comparison to the lateral dimension 50 of the transistor 101 shown in FIG. 3. The reduced lateral dimension 17 advantageously attains a reduction in the surface area used to form the lateral source/drain transistors in comparison to the surface area of the transistor 101. A comparison of the lateral dimensions of the lateral source/drain transistors 1 shown in FIG. 2 and the transistor 1 shown in FIG. 1 illustrates the advantageous reduction in lateral dimension of the lateral source/drain transistors 1. The reduction in surface area advantageously results in smaller transistors and higher packing density. Integrated circuits attaining an increased functionality and higher performance are fabricated for any given chip size using the lateral source/drain transistors.

The lateral source/drain transistors 1 utilize S/D contact regions 98 that are formed on and adjacent to side-walls 78, advantageously allowing an increased contact area to S/D regions 98 while the lateral surface area of the lateral source/drain transistors 1 is reduced. The increased S/D contact surface area results in lower S/D contact resistance than is possible for the conventional transistor 101 without greatly increasing the size of S/D contact regions 42 and 46 and thus without increasing the transistor surface area.

Figure 5:
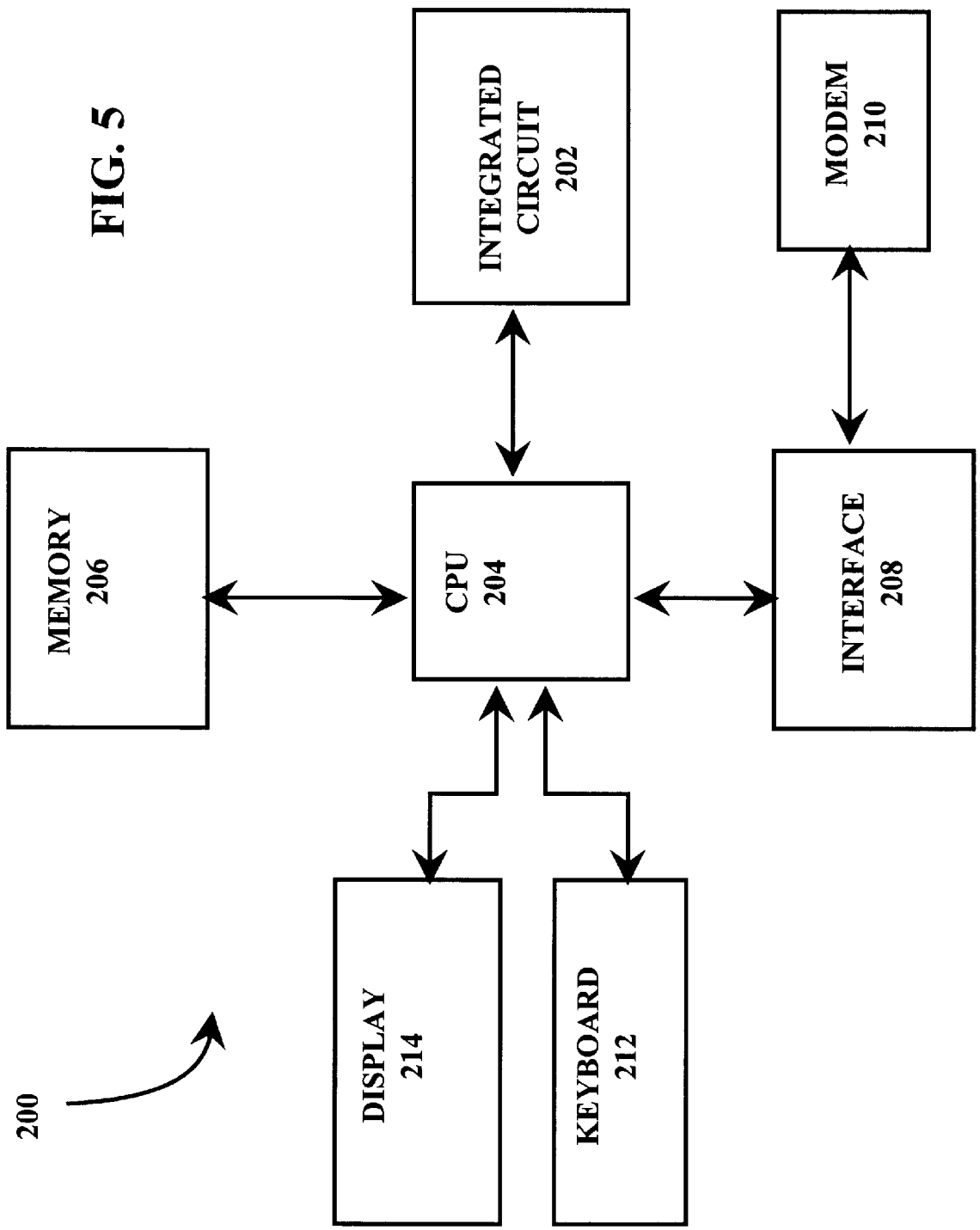
FIG. 5 is a schematic block diagram illustrating a computer system including an integrated circuit including vertical transistors with spacer gates fabricated using a method as depicted in FIGS. 4A through 4H.

Referring to FIG. 5, a computer system 200 includes an integrated circuit 202, a central processing unit 204, a memory 206, and an interface 208, connected to a modem 210. The computer system 200 also includes a keyboard 212 and a display 214 forming a user interface.

The described transistor structure and method achieve substantial advantages over conventional structures and methods in forming a transistor with significantly less surface area while attaining increased performance through reduced contact resistance to S/D regions. The reduction of surface area of a device structure results in integrated circuits having improved functionality, greater complexity, higher reliability and lower cost.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An integrated circuit chip including an integrated circuit fabricated using the method of fabricating an integrated circuit comprising:

etching selectively patterned trenches into a semiconductor substrate, the trenches being etched to form substantially vertical lateral sidewalls of the semiconductor substrate defining boundaries of an active area of a device;

forming an etched polysilicon gate electrode on the semiconductor substrate overlying the active region and electrically isolated from the semiconductor substrate by a gate oxide layer, the polysilicon gate electrode being etched to form substantially vertical lateral sidewalls;

implanting ions into the semiconductor substrate to form lightly-doped regions self-aligned with the polysilicon gate electrode and extending horizontally along a surface of the semiconductor substrate; and implanting ions into the semiconductor substrate to form a first doped region adjacent to a first vertical lateral sidewall of the semiconductor substrate vertical lateral sidewalls and to form a second doped region adjacent to a second vertical lateral sidewall of the semiconductor substrate vertical lateral sidewalls, the first and second doped regions being separated by a channel region of the semiconductor substrate active region, the first and second doped regions being implanted along a vertical plane along the vertical lateral sidewall, extending essentially orthogonal to the lightly-doped regions with the maximum lateral implant depth of the first and second doped regions being controlled so that the first and second doped regions do not completely cover the lightly-doped regions, the semiconductor substrate vertical lateral sidewalls being accessed for electrical connection to the first and second doped regions via the trenches;

depositing an isolating layer overlying the semiconductor substrate and overlying the polysilicon gate electrode;

etching a plurality of vias into the isolating layer including a gate via that etches to the polysilicon gate electrode, a first source/drain via that etches along the vertical edge of the first vertical lateral sidewall, and a second source/drain via that etches along the vertical edge of the second vertical lateral sidewall; and filling the gate via, the first source/drain via, and the second source/drain via with respective metallic contact plugs.

2. An integrated circuit according to claim 1 fabricated using the method of fabricating an integrated circuit further comprising:

forming suicide source/drain contacts on the first vertical sidewall surface and the second vertical sidewall surface of the semiconductor substrate.

3. An integrated circuit according to claim 1 fabricated using the method of fabricating an integrated circuit further comprising:

forming metal silicide source/drain contacts on the first vertical sidewall surface electrically coupled to the source region and the second vertical sidewall surface of the semiconductor substrate electrically coupled to the drain region; and forming a gate metal silicide contact region on the substantially planar surface of the gate electrode.

4. An integrated circuit according to claim 1 fabricated using the method of fabricating an integrated circuit further comprising:

selecting the metal silicide source/drain contacts and the gate metal silicide contact region of a metal silicide of a metal selected from a group including titanium, cobalt, molybdenum and tungsten.

5. A microprocessor on an integrated circuit chip including an integrated circuit fabricated using the method of fabricating an integrated circuit comprising:

etching selectively patterned trenches into a semiconductor substrate, the trenches being etched to form substantially vertical lateral sidewalls of the semiconductor substrate defining boundaries of an active area of a device;

forming an etched polysilicon gate electrode on the semiconductor substrate overlying the active region and electrically isolated from the semiconductor substrate by a gate oxide layer, the polysilicon gate electrode being etched to form substantially vertical lateral sidewalls;

implanting ions into the semiconductor substrate to form lightly-doped regions self-aligned with the polysilicon gate electrode and extending horizontally along a surface of the semiconductor substrate; and implanting ions into the semiconductor substrate to form a first doped region adjacent to a first vertical lateral sidewall of the semiconductor substrate vertical lateral sidewalls and to form a second doped region adjacent to a second vertical lateral sidewall of the semiconductor substrate vertical lateral sidewalls, the first and second doped regions being separated by a channel region of the semiconductor substrate active region, the first and second doped regions being implanted along a vertical plane along the vertical lateral sidewall, extending essentially orthogonal to the lightly-doped regions with the maximum lateral implant depth of the first and second doped regions being controlled so that the first and second doped regions do not completely cover the lightly-doped regions, the semiconductor substrate vertical lateral sidewalls being accessed for electrical connection to the first and second doped regions via the trenches;

depositing an isolating layer overlying the semiconductor substrate and overlying the polysilicon gate electrode;

etching a plurality of vias into the isolating layer including a gate via that etches to the polysilicon gate electrode, a first source/drain via that etches along the vertical edge of the first vertical lateral sidewall, and a second source/drain via that etches along the vertical edge of the second vertical lateral sidewall; and filling the gate via, the first source/drain via, and the second source/drain via with respective metallic contact plugs.

6. An integrated circuit according to claim 5 fabricated using the method of fabricating an integrated circuit further comprising:

forming silicide source/drain contacts on the first vertical sidewall surface and the second vertical sidewall surface of the semiconductor substrate.

7. An integrated circuit according to claim 5 fabricated using the method of fabricating an integrated circuit further comprising:

forming metal silicide source/drain contacts on the first vertical sidewall surface electrically coupled to the source region and the second vertical sidewall surface of the semiconductor substrate electrically coupled to the drain region; and forming a gate metal silicide contact region on the substantially planar surface of the gate electrode.

8. An integrated circuit comprising:

a semiconductor substrate including an active region and having trenches etched lateral to the active region, the semiconductor substrate having a substantially horizontal surface and having first and second substantially vertical lateral sidewall surfaces adjacent to the etched trenches;

a gate electrode formed on the horizontal surface of the semiconductor substrate overlying the active region and isolated from the semiconductor substrate by a gate oxide layer, the gate electrode having a substantially planar surface and substantially vertical lateral sidewalls;

lightly-doped regions implanted into the horizontal surface of the semiconductor substrate self-aligned with the polysilicon gate electrode and extending horizontally along a surface of the semiconductor substrate;

a source region implanted into the active region at an angle into the first vertical lateral sidewall surface of the semiconductor substrate; and a drain region implanted into the active region at an angle into the second vertical lateral sidewall surface of the semiconductor substrate, the source region and drain region being separated by a channel region of the semiconductor substrate active region, the source and drain regions being implanted along a vertical plane along the vertical lateral sidewall, extending essentially orthogonal to the lightly-doped regions with the maximum lateral implant depth of the first and second doped regions being controlled so that the first and second doped regions do not completely cover the lightly-doped regions, the first and second vertical lateral sidewall surfaces being accessed for electrical connection to the source region and the drain region, respectively;

an isolating layer overlying the semiconductor substrate and overlying the gate electrode; the isolating layer having a plurality of vias including a gate via extending to the polysilicon gate electrode, a first source/drain via extending through the isolating layer along the vertical edge of the first vertical lateral sidewall, and a second source/drain via extending through the isolating layer along the vertical edge of the second vertical lateral sidewall; and a plurality of metallic gate contact plugs including a gate plug filling the gate via, a first source/drain plug filling the first source/drain via, and a second source/drain plug filling the second source/drain.

9. An integrated circuit according to claim 8 further comprising:

spacers coupled to the substantially vertical lateral sidewalls of the gate electrode and formed on the horizontal surface of the semiconductor substrate overlying the active region lateral to the gate electrode.

10. An integrated circuit according to claim 8 further comprising:

dielectric spacers coupled to the substantially vertical lateral sidewalls of the gate electrode and formed on the horizontal surface of the semiconductor substrate overlying the active region lateral to the gate electrode.

11. An integrated circuit according to claim 8 further comprising:

silicide source/drain contacts formed on the first vertical sidewall surface and the second vertical sidewall surface of the semiconductor substrate.

12. An integrated circuit according to claim 8 further comprising:

metal silicide source/drain contacts formed on the first vertical sidewall surface electrically coupled to the source region and the second vertical sidewall surface of the semiconductor substrate electrically coupled to the drain region; and a gate metal silicide contact region formed on the substantially planar surface of the gate electrode.

13. An integrated circuit according to claim 12 wherein:

the metal silicide source/drain contacts and the gate metal silicide contact region are metal suicides of a metal selected from a group including titanium, cobalt, molybdenum and tungsten.

14. An integrated circuit according to claim 8 further comprising:

a lightly-doped drain implanted into the drain region on the horizontal surface adjacent to the second vertical lateral sidewall surface of the semiconductor substrate active region, the drain region being implanted to a first dopant concentration by a dopant having a conductivity opposite a conductivity of the channel region, and the lightly-doped drain region being implanted to a second dopant concentration less than the first dopant concentration and having a conductivity the same as the conductivity of the drain region.

15. An integrated circuit according to claim 8 further comprising:
- a lightly-doped drain implanted into the source region on the horizontal surface adjacent to the first vertical lateral sidewall surface and doped into drain region on the second vertical lateral sidewall surface of the semiconductor substrate active region,
- the drain region and the source region being implanted to a first dopant concentration by a dopant having a conductivity opposite a conductivity of the channel region, and
- the lightly-doped drain region being implanted to a second dopant concentration less than the first dopant concentration and having a conductivity the same as the conductivity of the drain region and the source region.

16. An integrated circuit according to claim 8 further comprising:
- a first spacer and a second spacer coupled to the substantially vertical lateral sidewalls of the gate electrode and formed on the horizontal surface of the semiconductor substrate overlying the active region lateral to the gate electrode, wherein
- the source region and the drain region are self-aligned to the polysilicon gate and underlying the first spacer and the second spacer, respectively.

17. An integrated circuit chip including an integrated circuit according to claim 8.

18. A microprocessor on an integrated circuit chip including an integrated circuit according to claim 8.

* * * * *